United States Patent
Ogawa et al.

(10) Patent No.: US 7,151,027 B1
(45) Date of Patent: Dec. 19, 2006

(54) METHOD AND DEVICE FOR REDUCING INTERFACE AREA OF A MEMORY DEVICE

(75) Inventors: Hiroyuki Ogawa, Sunnyvale, CA (US); Yider Wu, Campbell, CA (US); Kuo-Tung Chang, Saratoga, CA (US); Yu Sun, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 29 days.

(21) Appl. No.: 10/859,369

(22) Filed: Jun. 1, 2004

(51) Int. Cl.
*H01L 21/336* (2006.01)

(52) U.S. Cl. .................. 438/257; 438/238; 438/381; 257/E21; 257/613; 257/694; 257/645

(58) Field of Classification Search ............ 438/257, 438/258, 238, 381, 647, 657, 734, 735, 954
See application file for complete search history.

(56) References Cited

U.S. PATENT DOCUMENTS

| | | | | |
|---|---|---|---|---|
| 5,303,185 A | * | 4/1994 | Hazani | 365/185.26 |
| 5,666,307 A | * | 9/1997 | Chang | 365/185.03 |
| 5,953,254 A | * | 9/1999 | Pourkeramati | 365/185.26 |
| 6,037,222 A | * | 3/2000 | Huang et al. | 438/257 |
| 6,808,985 B1 | * | 10/2004 | Lee et al. | 438/257 |
| 2005/0127428 A1 | * | 6/2005 | Mokhlesi et al. | 257/315 |

* cited by examiner

*Primary Examiner*—David Nhu

(57) ABSTRACT

A method and device for reducing interface area of a memory device. A poly-2 layer is formed above a substrate at an interface between a memory array and a periphery of the memory device. The poly-2 layer is etched proximate to the memory array. The poly-2 layer is etched proximate to the periphery such that a portion of the poly-2 layer remains at the interface.

14 Claims, 6 Drawing Sheets

METHOD AND DEVICE FOR REDUCING INTERFACE AREA OF A MEMORY DEVICE

TECHNICAL FIELD

The present invention relates to the field of floating gate devices. Specifically, the present invention relates to reducing the interface area between a memory array and a periphery of a memory device.

BACKGROUND ART

A modem integrated circuit (IC), for example a flash memory device, may have millions to hundreds of millions of devices made up of complex, multi-layered structures that are fabricated through hundreds of processing steps. Those structures are formed by repeated deposition and patterning of thin films on a silicon substrate, also known as a wafer.

One important goal of the semiconductor industry is to reduce the size of memory devices. In reducing the size of operational components (e.g., a memory array) and periphery components, an important consideration is the interface between the operational components and periphery components. Current fabrication processes for forming memory devices typically form the operational components and the periphery components using separate processes. For example, when the periphery components are formed only the periphery is etched, and when the memory array is formed, only the memory array is etched. By forming the periphery components and the memory array using different processes, a number of steps in the interface area are created. A step exists where two adjacent structures have a different height, as shown in FIG. 1.

FIG. 1 is a diagram of a side view of a portion of an interface area of an exemplary memory device 100, in accordance with the prior art. By using different processes to form the memory array and the periphery components, respectively, steps are created. Substrate 110 has been etched wherein two structures 115 and 120 remain. As can be seen, structure 120 is higher than structure 115. In particular, the height of the step is hard to control because the different heights are created using different processes.

Sidewall spacers are commonly formed after the individual transistors of the memory array have been formed. When the sidewall spacers are formed, stringer spacers (e.g., stringer spacers 130 of FIG. 1) are formed in the interface area at the steps. A stringer spacer is a small component that is easily peeled or removed from the memory device. If removed, the debris may be displaced to the memory array or periphery componentry. This debris may result in a yield loss of performance by the memory array. Furthermore, because it is difficult to control the height of the steps, it is also hard to control the height of the stringer spacers.

In order to eliminate the risks caused by stringer spacer debris, current memory devices include a salicide block fabricated over the interface area (e.g., salicide layer 140 of FIG. 1). After transistor formation, a salicide block is formed over the interface, requiring an additional mask, adding costs to the fabrication process. Moreover, the salicide block requires additional area of the interface. In particular, the area required by the salicide block considerably limits the ability to reduce the size of the interface area.

DISCLOSURE OF INVENTION

Various embodiments of the present invention, a method and device for reducing interface area of a memory device, are described. In one embodiment, a memory device is fabricated, in which a poly-2 layer is formed above a substrate at an interface between a memory array and a periphery of the memory device. The poly-2 layer is etched proximate to the memory array. The poly-2 layer is etched proximate to the periphery such that a portion of the poly-2 layer remains at the interface. In one embodiment, the portion of the poly-2 layer remaining at the interface is the same height as the memory array proximate to the memory array and the same height as the periphery proximate to the periphery, such that step size is smoothed out reducing the occurrence of stringers from spacer etching.

BRIEF DESCRIPTION OF DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

MODE(S) FOR CARRYING OUT THE INVENTION

Reference will now be made in detail to embodiments of the invention, examples of which are illustrated in the accompanying drawings. While the invention will be described in conjunction with the described embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

The present invention provides a method and structure for reducing interface area between the memory array and the periphery of a memory device. In one embodiment, the boundaries of the various masks used to form a polysilicon layer are adjusted such that a polysilicon interface structure remains in the interface. The polysilicon interface structure is operable to smooth out any steps caused by the etching. In particular, the height of the polysilicon interface structure is easy to control, eliminating the creation of stringer spacers. Furthermore, embodiments of the present invention do not require a salicide layer, thereby reducing the number of masks needed to fabricate the memory device and to allow for a reduction in interface area.

Figure 1:
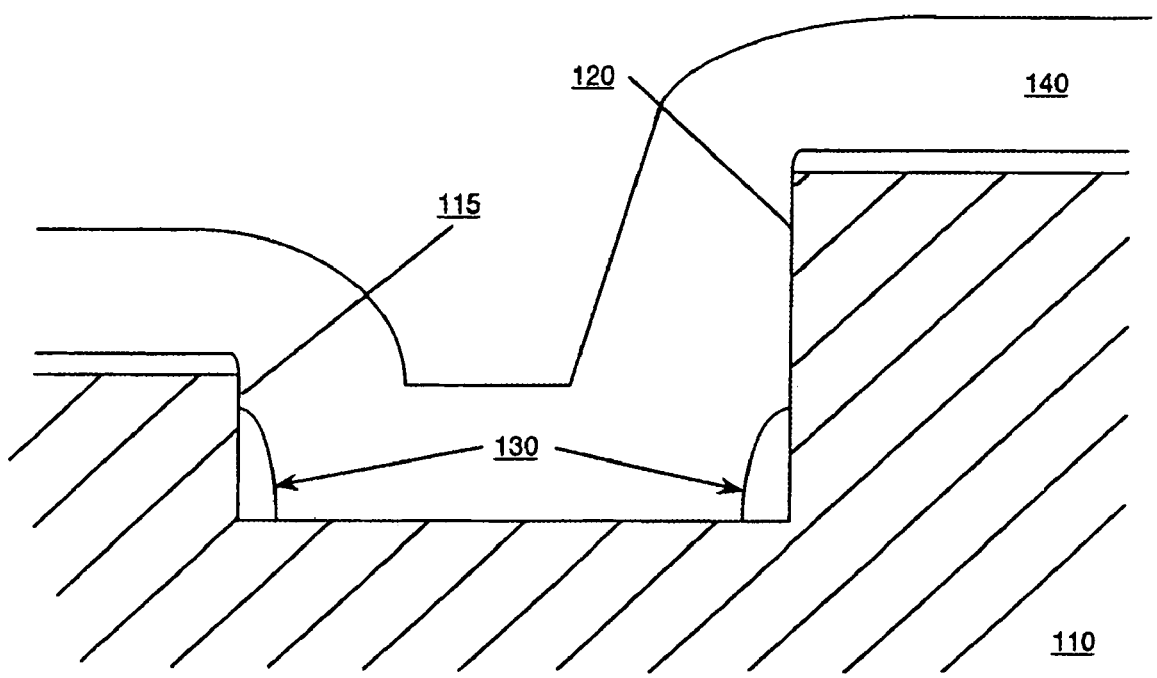
FIG. 1 is a diagram of a side view of a portion of an interface area of an exemplary memory device, in accordance with the prior art.
Figure 2:
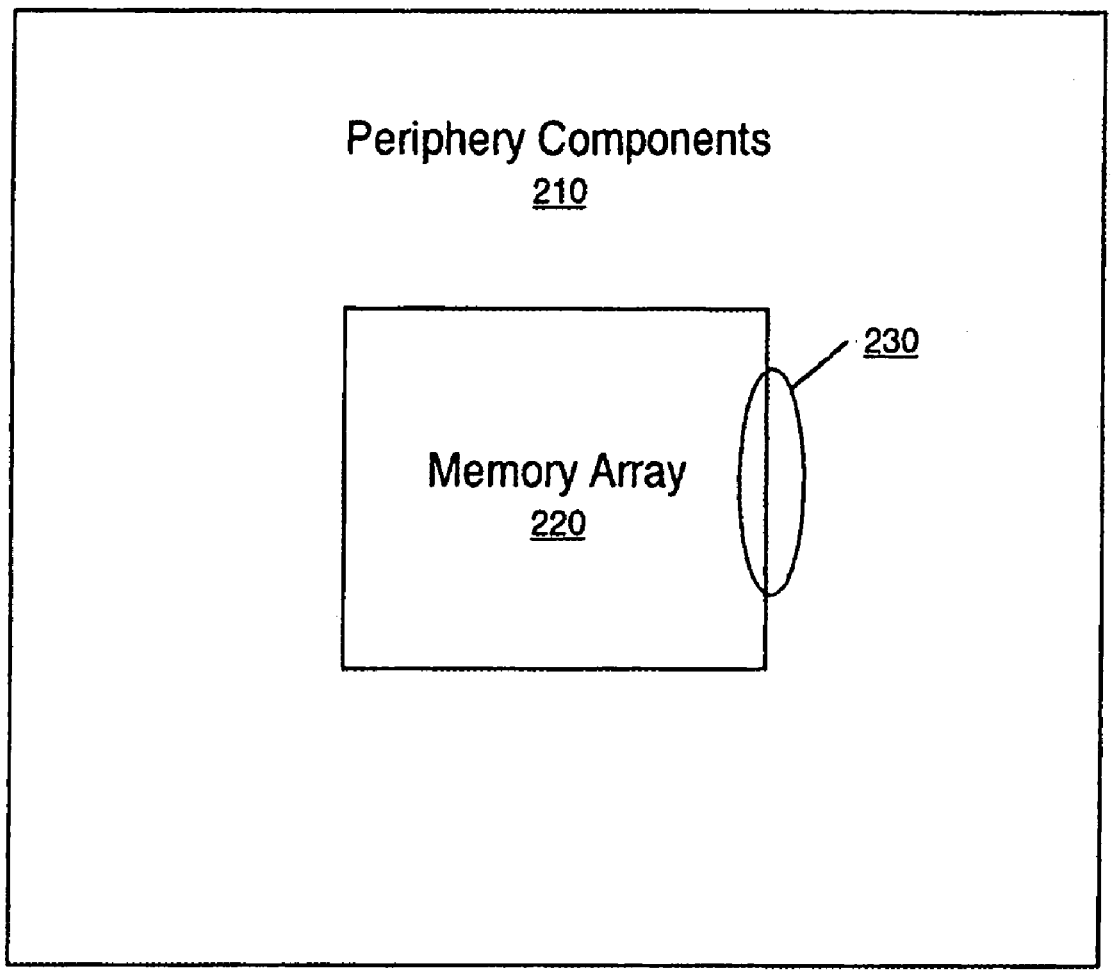
FIG. 2 is a block diagram of a memory device in accordance with an embodiment of the present invention.

FIG. 2 is a block diagram of a memory device in accordance with an embodiment of the present invention. Memory device 200 includes a periphery components portion 210 and a memory array portion 220. In one embodiment, memory device 200 is a flash memory device. Although only one memory array 220 is shown in memory device 200, it is completely viable for there to be more than one memory array 220 being formed on memory device 200. In one embodiment, memory array 220 is manufactured in a flash memory process that is well known in the art. Included in the manufacture of memory array 220 may be source-drain portions, poly one and poly-2 layers, tunnel oxide, silicon, field oxide, and the like. In addition, interface area 230 of FIG. 2, which is better illustrated in FIGS. 3A through 3G, includes poly-1 and poly-2 layers.

FIGS. 3A through 3G are diagrams of the side view of an exemplary interface area of a memory device illustrating steps in a process for forming an interface structure 360 (FIG. 3G), in accordance with an embodiment of the present invention. Specifically, FIGS. 3A, 3B, 3C, 3D, 3E, 3F and 3G illustrate a process for fabricating an interface structure 360 according to one embodiment of the present invention. In one embodiment, interface structure 360 includes polysilicon. In one such embodiment, interface structure 360 includes a poly-1 layer and a poly-2 layer.

It is understood that FIGS. 3A through 3G are not drawn to scale and that only portions of the substrate 300 and other layers are shown. For simplicity of discussion and illustration, the process is described for a single interface structure 360, although in actuality multiple interface structures may be formed.

Furthermore, although the device being formed is referred to as a an interface structure, it is appreciated that FIGS. 3A through 3G only show an interface structure in the process of being formed, and not necessarily a completely formed interface structure. It is appreciated that other processes and steps associated with the fabrication of an interface structure may be performed along with the process illustrated by FIGS. 3A through 3G; that is, there may be a number of process steps before and after the steps shown and described by FIGS. 3A through 3G. Importantly, embodiments of the present invention can be implemented in conjunction with these other (conventional) processes and steps without significantly perturbing them. Generally speaking, the various embodiments of the present invention can replace a conventional process without significantly affecting the peripheral processes and steps.

Figure 3A:
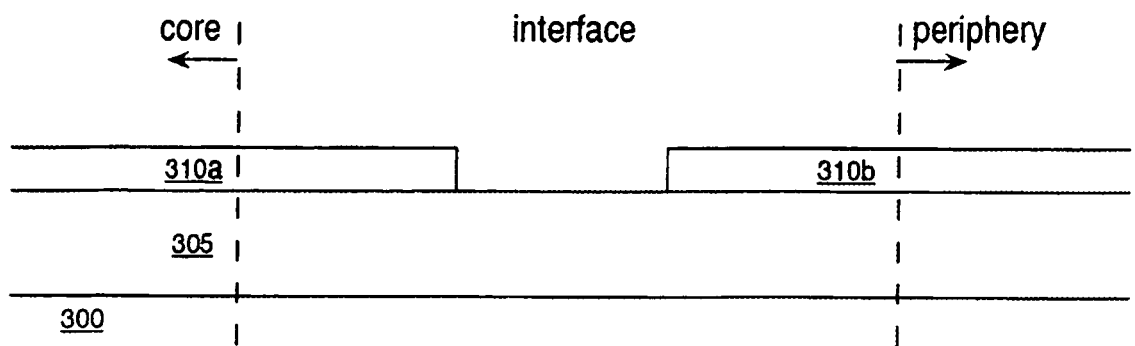
FIGS. 3A through 3G are diagrams of the side view of an exemplary interface area of a memory device illustrating steps in a process for forming an interface structure, in accordance with an embodiment of the present invention.

Referring first to FIG. 3A, in the present embodiment, substrate 300, isolation area 305 (e.g., a shallow trenched area), and gate polysilicon ("poly-1") 310a and 310b are shown in cross section. In one embodiment, isolation area 305 is filled with $SiO_2$. Line 302 indicates the approximate border between the memory array (e.g., care) and the interface area. Similarly, line 304 indicates the approximate border between the interface area and the periphery. The portion of substrate 300 of the memory array is typically doped with n-type and p-type materials to form a number of regions in the memory array. For example, in an n-channel transistor—in particular, in a high voltage n-channel transistor—the substrate 300 may include silicon doped with a p-type material, a deep n-well, a high voltage p-well, and high voltage n-wells. It should be appreciated that the portion of poly-1 310b that resides in the interface and periphery regions may not be needed to form active transistors, and is therefore optional.

Figure 3B:
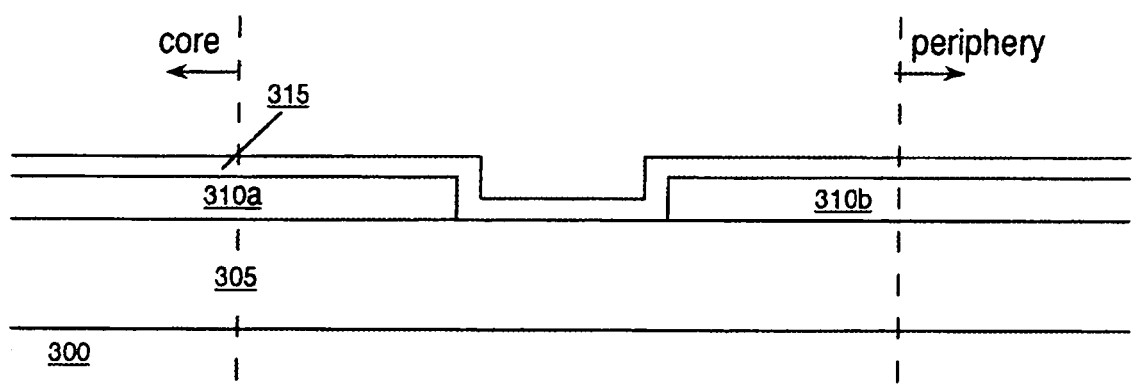

Referring now to FIG. 3B, in the present embodiment, a film of dielectric material 315 is applied over substrate 300 and poly-1 310a and 310b, essentially coating the exposed (upper) surfaces of substrate 300 and poly-1 310a and 310b. Different dielectric materials may be used; in one embodiment, the dielectric material includes $SiO_2$, and in another embodiment the dielectric material includes $Si_3N_4$. In one embodiment a oxide-nitride-oxide (ONO) dielectric layer is applied.

Figure 3C:
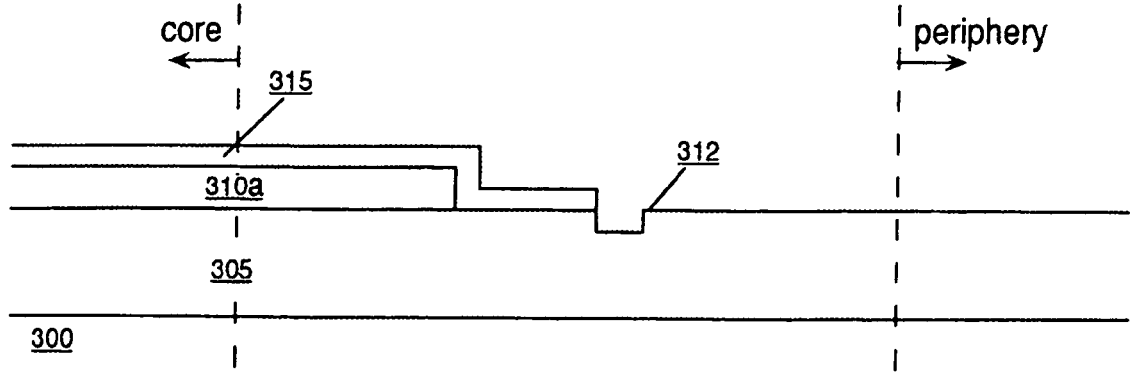

Referring next to FIG. 3C, in the present embodiment, a known process (such as an etch back process) is used to remove selectively the dielectric material 315 and poly-1 310b. Significantly, a portion of the dielectric material 315 overlying poly-1 310b and a portion of substrate 300 is deposited and then selectively removed. In one embodiment, the deposition and removal is necessary for the fabrication of transistors of the memory array. In one embodiment, notch 312 is etched into isolation area 305. It should be appreciated that notch 312 is a small trench that is etched as a result of the process used to remove dielectric material 315 and poly-1 310b.

Figure 3D:
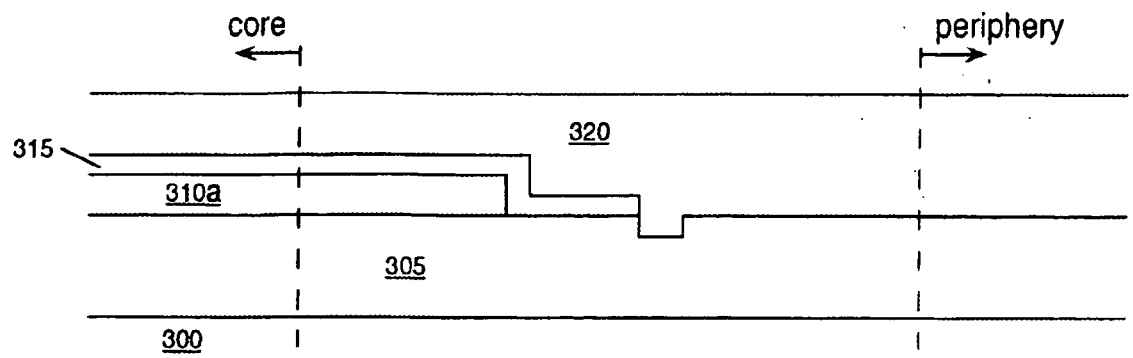

With reference to FIG. 3D, in the present embodiment, a second polysilicon layer (poly-2) 320 is deposited above dielectric material 315 and substrate 300. In one embodiment, poly-2 layer 320 is used to form a word line for use in the active transistor of the memory array.

Figure 3E:
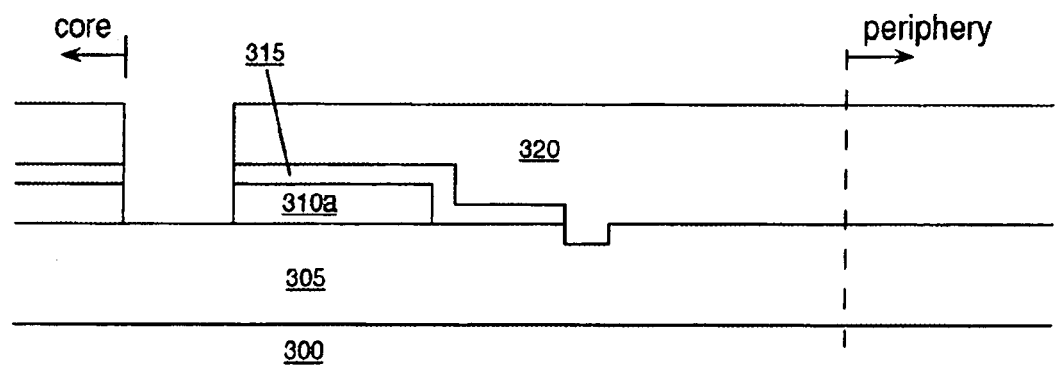

With reference next to FIG. 3E, in the present embodiment, a known process (such as a stacked gate etch) is used to etch a portion of poly-1 310a, dielectric material 315, and poly-2 320 proximate to the memory array. The etch is used to form individual transistors of from the polysilicon layers. In one embodiment, the stacked gate edge uses a stacked gate mask above the interface region and the periphery. The etch creates a distinct boundary between the memory array and the interface region. By locating the stacked gate mask close to the core region, poly-1 310a and poly-2 320 remain in the interface region.

Figure 3F:
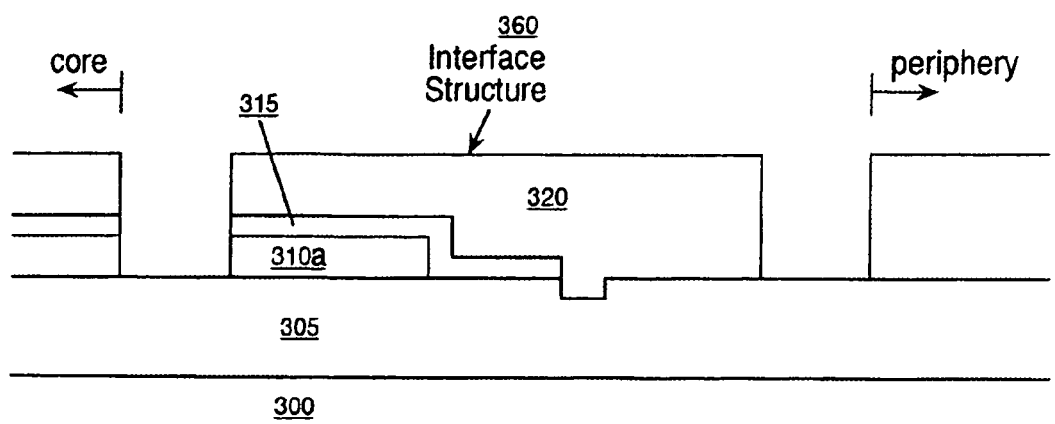

With reference next to FIG. 3F, in the present embodiment, a known process (such as a second gate etch) is used to etch a portion of poly-2 320 proximate to the periphery. The etch is used to form interface structure 360. In one embodiment, the second gate edge uses a second gate mask above the interface region and the memory array. The second gate etch creates a distinct boundary between the memory array and the interface region. By locating the second gate etch close to the periphery region, only part of the poly-2 320 in the interface region is etched, keeping interface structure 360, including poly-1 310a and poly-2 320, in the interface region. In one embodiment, interface structure 360 is the same height as the memory array proximate to the memory array and the same height as the periphery proximate to the periphery, such that step size is smoothed out reducing the occurrence of stringers from spacer etching.

Figure 3G:
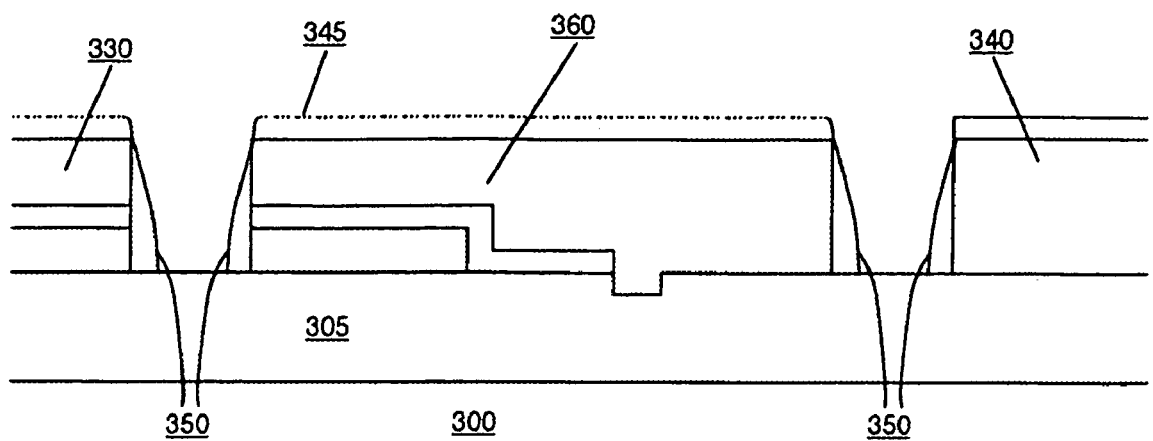

Referring now to FIG. 3G, the memory device now includes interface structure 360 as well as transistor 330 and periphery poly-2 340. It should be appreciated that transistor 330 is the last active transistor of the memory array next to the interface area. A film of dielectric material 345 is applied over substrate 300, interface structure 360, transistor 330 and periphery poly-2 340, essentially coating the exposed (upper) surfaces of substrate interface structure 360, transistor 330 and periphery poly-2 340. Different dielectric materials may be used; in one embodiment, the dielectric material includes $SiO_2$, and in another embodiment the dielectric material includes $Si_3N_4$. A known process (such as an etch back process) is used to remove selectively the dielectric material to form a first set of spacers 350 along the side walls of interface structure 360, transistor 330 and periphery poly-2 340. In one embodiment, a second set of spacers are formed adjacent to the first spacers 350.

Figure 4:
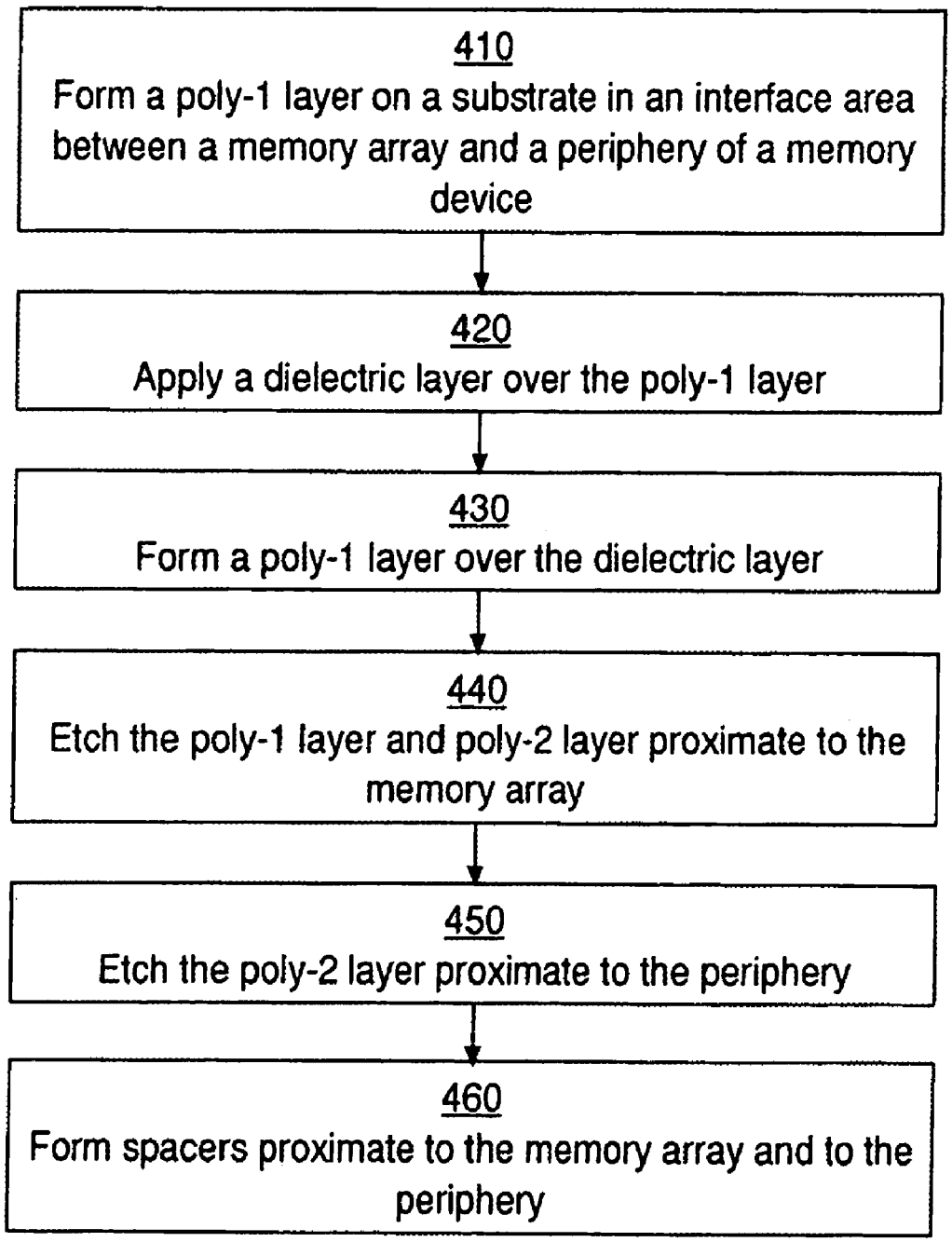
FIG. 4 is a flowchart illustrating steps in a process for fabricating a memory device, in accordance with an embodiment of the present invention.

FIG. 4 is a flowchart illustrating steps in a process 400 for fabricating a memory device, in accordance with an embodiment of the present invention. Although specific steps are disclosed in process 400, such steps are exemplary. That is, the present invention is well suited to performing various other steps or variations of the steps recited in process 400.

At step 410, a first polysilicon layer (e.g., poly-1) is formed on a substrate in an interface area between a memory array and a periphery of the memory device. In one embodiment, a gate oxide is grown on the substrate. At step 420, in one embodiment, a dielectric layer is applied over the first polysilicon layer. In one embodiment, the dielectric layer is an ONO layer. At step 430, a second polysilicon layer (e.g., poly-2) is formed over the dielectric layer. In one embodiment, a gate or gate poly is formed over the gate oxide).

At step 440, the poly-1 layer and the poly-2 layer are etched proximate to the memory array. In one embodiment, the etching is accomplished by performing a stacked gate etch. At step 450, the poly-2 layer is etched proximate to the periphery, such that an interface structure including a portion of the poly-1 layer and a portion of the poly-2 layer remains at the interface. In one embodiment, the etching is accomplished by performing a second gate etch.

Thus, according to the various embodiments of the present invention, the interface structure is the same height as the memory array proximate to the memory array and the same height as the periphery proximate to the periphery, such that step size is smoothed out reducing the occurrence of stringers from spacer etching. At step 460, spacers are formed proximate to the memory array and proximate to the periphery. In one embodiment, the spacers are nitride spacers.

To summarize, the described embodiments provide a method and structure for reducing interface area between the memory array and the periphery of a memory device. In one embodiment, the boundaries of the various masks used to form a polysilicon layer are adjusted such that a polysilicon interface structure remains in the interface. The polysilicon interface structure is operable to smooth out any steps caused by the etching. In particular, the height of the polysilicon interface structure is easy to control, eliminating the creation of stringer spacers. Furthermore, embodiments of the present invention do not require a salicide layer, thereby reducing the number of masks needed to fabricate the memory device and to allow for a reduction in interface area.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for fabricating a memory device, said method comprising:
    forming a poly-2 layer above a substrate at an interface between a memory array and a periphery of said memory device;
    etching said poly-2 layer proximate to said memory array; and
    etching said poly-2 layer proximate to said periphery such that a portion of said poly-2 layer remains at said interface.

2. The method as recited in claim 1 further comprising:
    forming a poly-1 layer above said substrate at said interface, such that said poly-1 layer is above said substrate and beneath said poly-2 layer;
    etching said poly-1 layer proximate to said memory array; and
    etching said poly-1 layer proximate to said periphery such that a portion of said poly-1 layer remains at said interface.

3. The method as recited in claim 1 wherein said etching said poly-2 layer proximate to said memory array is accomplished by performing a stacked gate etch.

4. The method as recited in claim 1 wherein said etching said poly-2 layer proximate to said periphery is accomplished by performing a second gate etch.

5. The method as recited in claim 1 further comprising:
    forming spacers proximate to said memory array; and
    forming spacers proximate to said periphery.

6. The method as recited in claim 2 further comprising forming an ONO layer above said poly-1 layer such that said ONO layer is above said poly-1 layer and beneath said poly-2 layer.

7. The method as recited in claim 1 wherein said portion of said poly-2 layer remaining at said interface is a same height as said memory array proximate to said memory array a same height as said periphery proximate to said periphery, such that step size is smoothed out reducing an occurrence of stringers from spacer etching.

8. A method for fabricating a memory device, said method comprising:
    forming a poly-1 layer above a substrate at an interface between a memory array and a periphery of said memory device;
    forming a poly-2 layer above said poly-1 layer at said interface;
    etching said poly-1 layer and said poly-2 layer proximate to said memory array; and
    etching said poly-2 layer proximate to said periphery, such that an interface structure including a portion of said poly-1 layer and a portion of said poly-2 layer remains at said interface.

9. The method as recited in claim 8 wherein said etching said poly-1 layer and said poly-2 layer proximate to said memory array is accomplished by performing a stacked gate etch.

10. The method as recited in claim 8 wherein said etching said poly-2 layer proximate to said periphery is accomplished by performing a second gate etch.

11. The method as recited in claim 8 further comprising:
    forming spacers proximate to said memory array; and
    forming spacers proximate to said periphery.

12. The method as recited in claim 11 wherein said spacers are nitride spacers.

13. The method as recited in claim 8 further comprising forming an ONO layer above said poly-1 layer such that said ONO layer is above said poly-1 layer and beneath said poly-2 layer.

14. The method as recited in claim 8 wherein said interface structure is a same height as said memory array proximate to said memory array and a same height as said periphery proximate to said periphery, such that step size is smoothed out reducing an occurrence of stringers from spacer etching.

* * * * *